(12) United States Patent
Kim et al.

(10) Patent No.: US 8,106,409 B2
(45) Date of Patent: Jan. 31, 2012

(54) THIN FILM TRANSISTOR ARRAY PANEL

(75) Inventors: Dong-Byum Kim, Seoul (KR); Chung Yi, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 38 days.

(21) Appl. No.: 11/285,935

(22) Filed: Nov. 23, 2005

(65) Prior Publication Data
US 2006/0131585 A1 Jun. 22, 2006

(30) Foreign Application Priority Data
Dec. 20, 2004 (KR) .................. 10-2004-0109052

(51) Int. Cl.
*H01L 29/06* (2006.01)
*H01L 27/148* (2006.01)
*H01L 27/15* (2006.01)

(52) U.S. Cl. .............. 257/88; 257/13; 257/79; 257/225

(58) Field of Classification Search .............. 257/98, 257/59, 66–75, 204, 288, 350, 13, 79, 225; 349/42; 430/5
See application file for complete search history.

(56) References Cited

U.S. PATENT DOCUMENTS

| | | | |
|---|---|---|---|
| 5,981,974 A | 11/1999 | Makita | |
| 6,613,620 B2 | 9/2003 | Fujimoto et al. | |
| 7,223,504 B2 * | 5/2007 | Lee et al. | 430/5 |
| 2004/0169183 A1 | 9/2004 | Fujimoto et al. | |
| 2005/0023531 A1 * | 2/2005 | Shoji et al. | 257/70 |
| 2005/0034653 A1 | 2/2005 | Im et al. | |
| 2005/0062052 A1 * | 3/2005 | Yang et al. | 257/79 |
| 2005/0095735 A1 * | 5/2005 | Fujita | 438/17 |
| 2005/0127367 A1 * | 6/2005 | Huh et al. | 257/72 |
| 2005/0142897 A1 * | 6/2005 | Kim et al. | 438/795 |
| 2005/0151146 A1 * | 7/2005 | Lee et al. | 257/98 |
| 2006/0152644 A1 * | 7/2006 | Yi | 349/42 |
| 2006/0157711 A1 * | 7/2006 | Kang | 257/72 |

FOREIGN PATENT DOCUMENTS

| | | |
|---|---|---|
| JP | 10-163495 | 6/1998 |
| JP | 2001-051298 | 2/2001 |
| JP | 2002-175028 | 6/2002 |
| JP | 2004-349415 | 12/2004 |
| JP | 2005-525689 | 8/2005 |
| KR | 1998-025162 | 7/1998 |
| KR | 1020000001167 | 1/2000 |
| KR | 1020030033132 | 5/2003 |

* cited by examiner

*Primary Examiner* — James Mitchell
(74) *Attorney, Agent, or Firm* — F. Chau & Associates, LLC

(57) ABSTRACT

A thin film transistor array panel is provided, which includes a substrate; a plurality of semiconductor islands formed on the substrate, the plurality of semiconductor islands including a plurality of first and second extrinsic regions, and a plurality of intrinsic regions; a gate insulating layer covering the semiconductor islands; a plurality of gate lines including a plurality of gate electrodes overlapping the intrinsic regions and formed on the gate insulating layer; a plurality of data lines connected to the first extrinsic regions and formed on the gate insulating layer; and a plurality of pixel electrodes connected to the second extrinsic regions, wherein a plurality of protrusions are formed on the surfaces of the semiconductor islands, and a length of a semiconductor island is a multiple of the a distance between at least two protrusions.

14 Claims, 20 Drawing Sheets

Fig. 8A
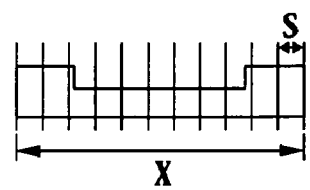
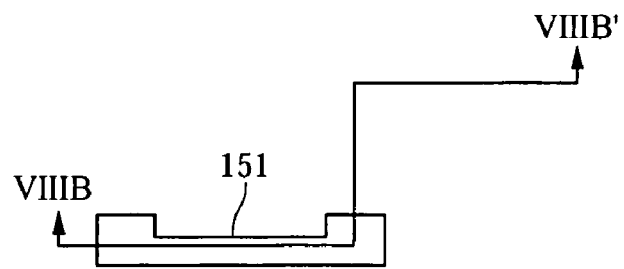

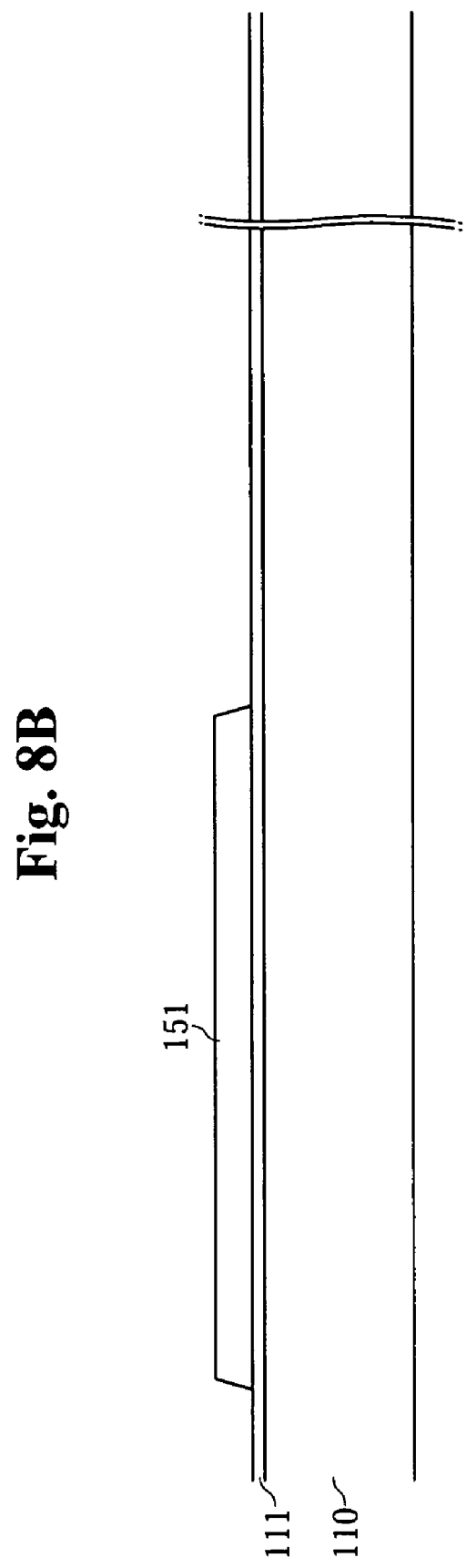

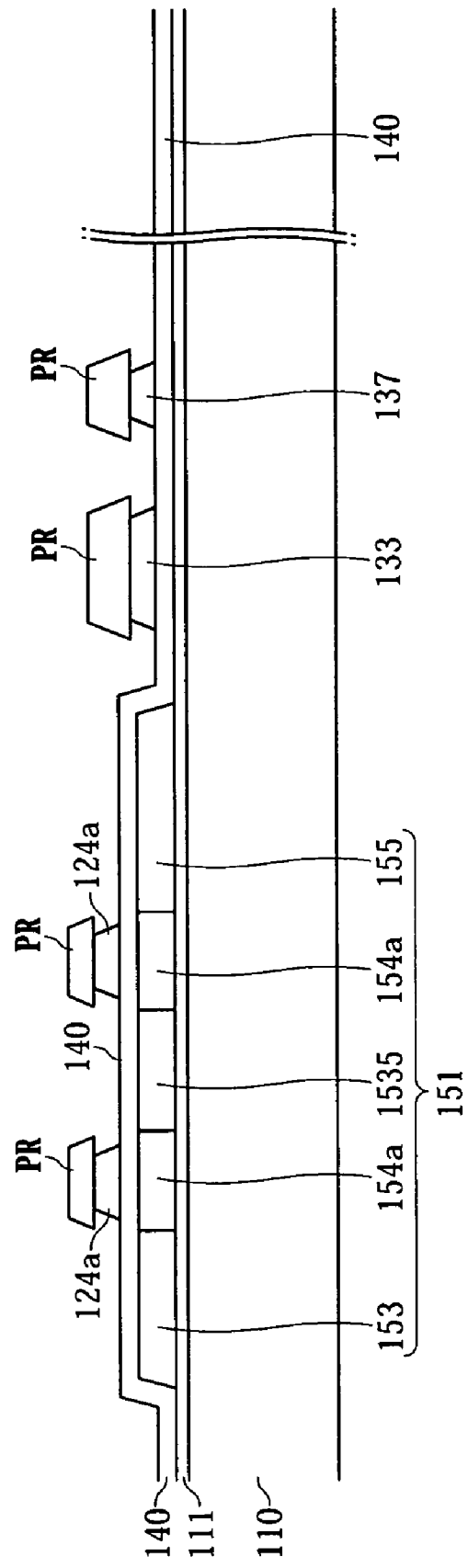

THIN FILM TRANSISTOR ARRAY PANEL

BACKGROUND OF THE INVENTION (a) Technical Field

The present disclosure relates to a thin film transistor array panel using polysilicon as a semiconductor.

(b) Discussion of Related Art

A thin film transistor array panel is used as a circuit substrate to individually drive each pixel in a flat panel display. The flat panel display is, for example, a liquid crystal display or an organic light emitting diode display and has a plurality of pixels.

The liquid crystal display (LCD) includes two panels provided with field-generating electrodes such as pixel electrodes and a common electrode, and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

The organic light emitting diode display (OLED) is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined, thereby emitting light.

Each pixel of the OLED includes two transistors such as a driving transistor and a switching transistor. The current for light emission is driven by the driving TFT and the amount of the current driven by the driving TFT is controlled by the data signals from the switching TFT.

The TFT includes a semiconductor made of amorphous silicon or crystalline silicon. Amorphous silicon is used in displays utilizing glass having a low melting point, since amorphous silicon film can be fabricated at a low temperature.

The amorphous silicon film has low carrier mobility. As a result, the amorphous silicon film may not be well suited for application to a high quality driving circuit of display panels. Whereas, since polycrystalline silicon has prominent electric field effect mobility, high frequency operation, and low leakage current, high quality driving circuits use the polycrystalline silicon.

The electrical characteristics of the TFT using polycrystalline silicon are influenced by the size and the uniformity of grain. In other words, the electric field effect mobility of the TFT is increased with increased size and uniformity of grain. As a result, attention has been directed to the method to form the polycrystalline silicon with increasing the size and the uniformity of grain.

Excimer laser annealing (ELA) and chamber annealing are typical methods for producing polycrystalline silicon. Recently, a sequential lateral solidification (SLS) process deriving lateral growth of silicon crystalline has been proposed.

The SLS technique utilizes a phenomenon that the silicon grains grow laterally with respect to the boundary of a liquid region and a solid region. In the SLS process, the sizes of the grains can be as much as the predetermined widths by controlling the irradiation range and the energy of a laser beam using an optic system and a mask that selectively passes the laser beam.

After the sequential lateral solidification, protrusions are formed on the surface of the polysilicon layer along the grain boundaries due to the grains growing and meeting each other. The protrusions prevent the flow of current, and result in degradation of the characteristics of the TFTs, thereby causing defects such as horizontal stripe or vertical stripe.

SUMMARY OF THE INVENTION

A thin film transistor array panel with uniform display quality is provided.

A thin film transistor array panel, in accordance with an embodiment of the present invention, includes a substrate; a plurality of semiconductor islands formed on the substrate and including a plurality of first and second extrinsic regions, and a plurality of intrinsic regions; a gate insulating layer covering the semiconductor islands; a plurality of gate lines including a plurality of gate electrodes overlapping the intrinsic regions and formed on the gate insulating layer; a plurality of data lines connected to the first extrinsic regions and formed on the gate insulating layer; and a plurality of pixel electrodes connected to the second extrinsic regions, wherein a plurality of protrusions are formed on the surfaces of semiconductor islands, and a length of a semiconductor island is a multiple of a distance between at least two protrusions.

The protrusions may extend perpendicular to the length direction of the semiconductor islands.

The protrusions may be spaced at uniform intervals.

The semiconductor islands may be crystallized by sequential lateral solidification.

The number of the protrusions formed on each semiconductor island may be the same.

The thin film transistor array panel may further include a plurality of storage electrode lines formed parallel the gate lines.

The thin film transistor array panel may further include a blocking layer formed between the substrate and the semiconductor islands.

The thin film transistor array panel may further include a passivation layer formed between the pixel electrodes and the gate and the data lines.

The thin film transistor array panel may further include an interlayer insulating layer formed between the gate lines and the data lines, and a plurality of output electrodes connecting the pixel electrodes to the second extrinsic regions, and formed between the passivation layer and the interlayer insulating layer. The second extrinsic regions may include a plurality of drain regions.

The thin film transistor array panel may further include partitions formed on the pixel electrodes, and a plurality of light emitting members formed on the pixel electrodes and disposed in the openings defined by the partitions.

BRIEF DESCRIPTION OF THE DRAWINGS

Preferred embodiments of the present invention can be understood in more detail from the following descriptions taken in conjunction with the accompanying drawings, in which:

FIG. 8A is a layout view of the TFT array panel in a step following the step shown in FIG. 4;

FIG. 8B is a sectional view of the TFT array panel shown in FIG. 8A taken along the lines VIIIB-VIIIB' and VIIIB'-VIIIB";

FIG. 9B is a sectional view of the TFT array panel shown in FIG. 9A taken along the lines IXB-IXB' and IXB'-IXB";

DETAILED DESCRIPTION OF THE PREFERRED EMBODIMENTS

Preferred embodiments of the present invention now will be described more fully hereinafter with reference to the accompanying drawings, in which preferred embodiments of the invention are shown. This invention may, however, be embodied in many different forms and should not be construed as limited to the embodiments set forth herein.

Figure 1:
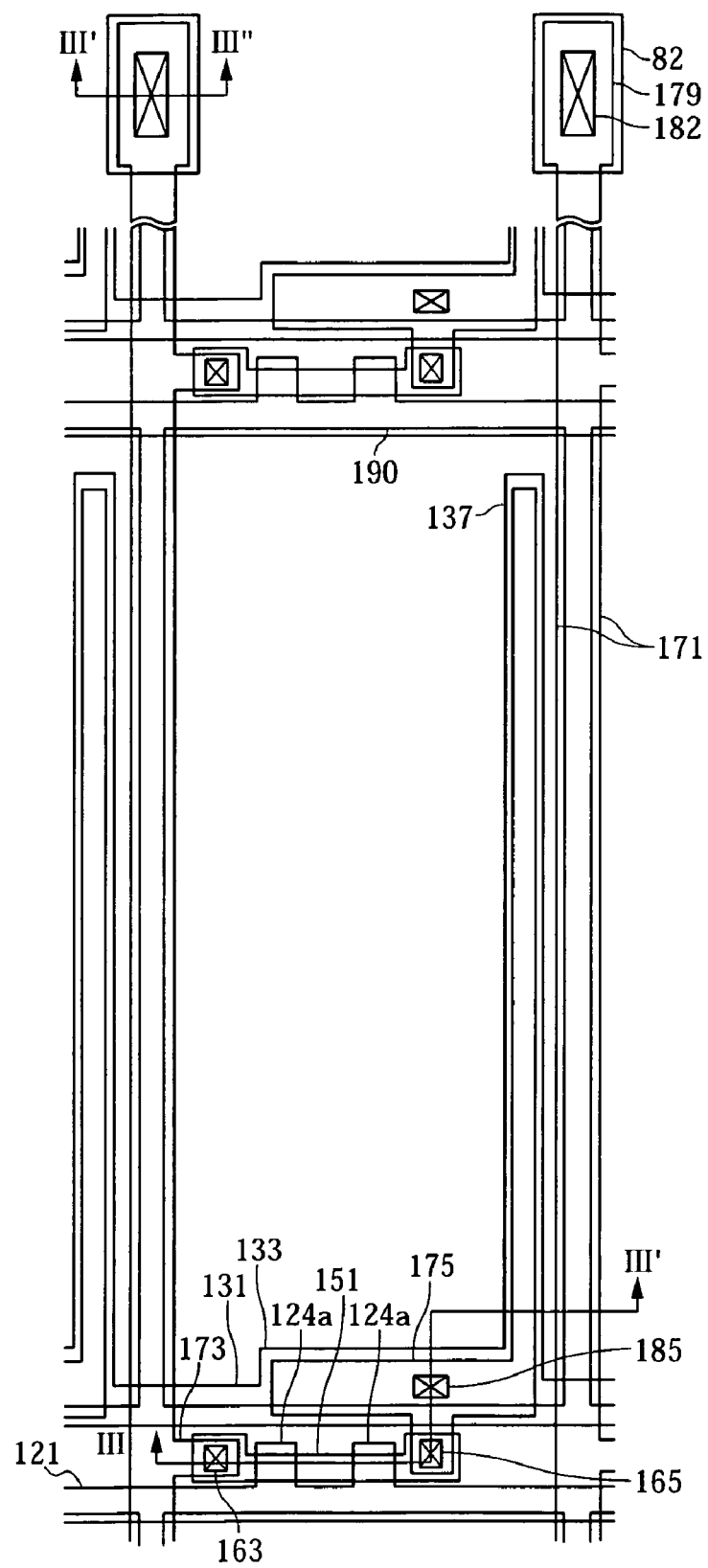
FIG. 1 is a layout view of a TFT array panel for an LCD according to an embodiment of the present invention.
Figure 2:
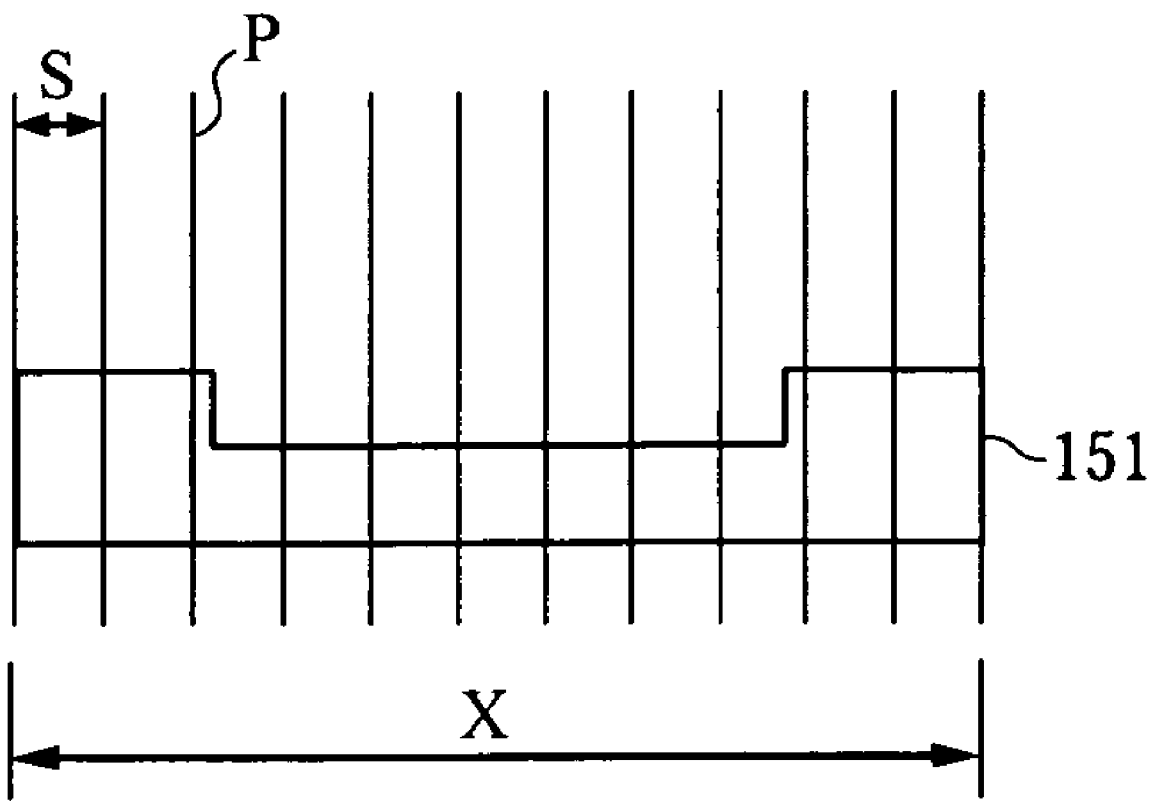
FIG. 2 is a layout view of protrusions formed on the semiconductor islands in the TFT array panel shown in FIG. 1.
Figure 3:
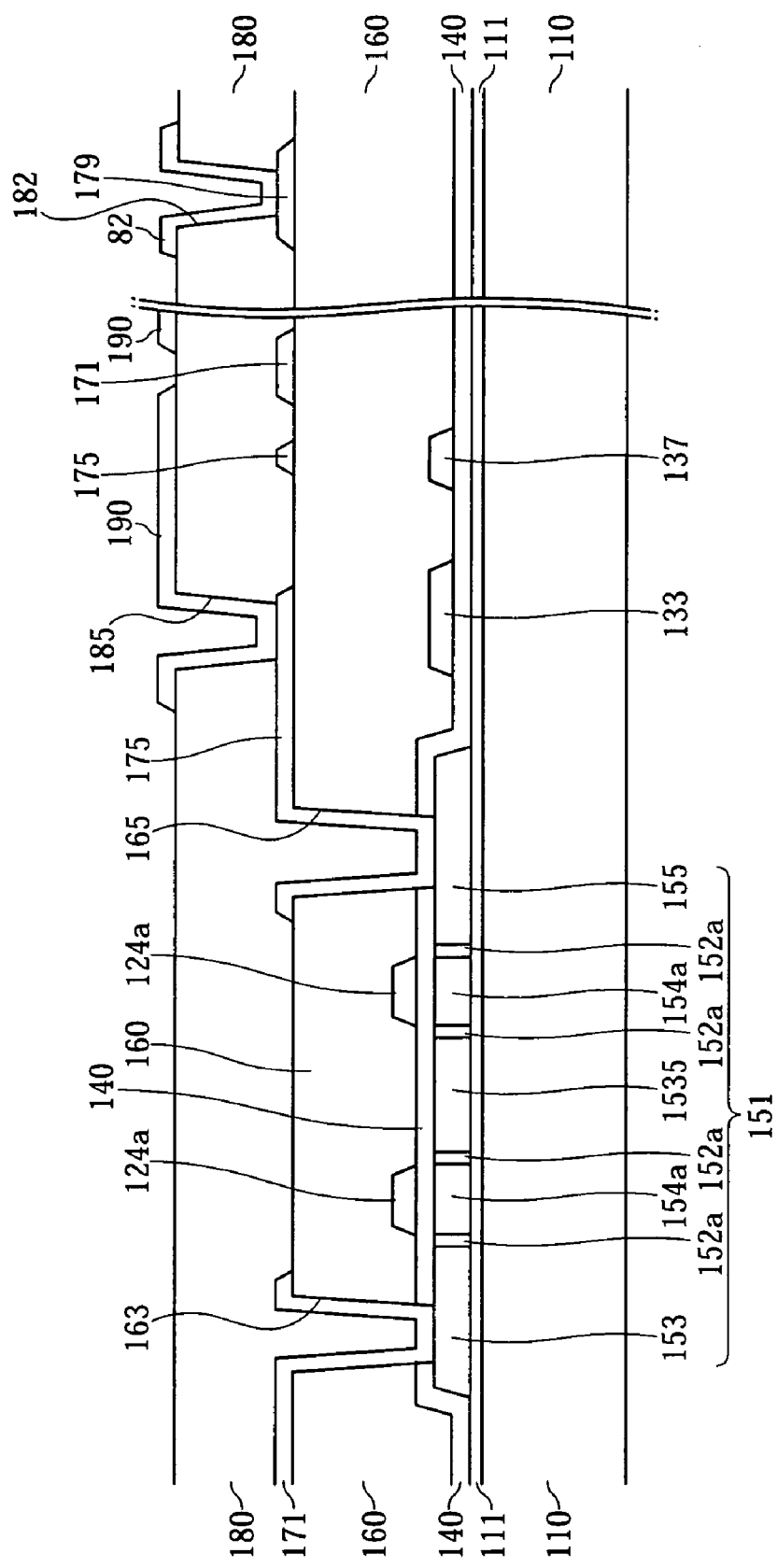
FIG. 3 is a sectional view of the TFT array panel shown in FIG. 1 taken along the lines III-III' and III'-III"

FIG. 1 is a layout view of a TFT array panel for an LCD according to an embodiment of the present invention. FIG. 2 is a layout view of protrusions formed on the semiconductor islands in the TFT array panel shown in FIG. 1. FIG. 3 is a sectional view of the TFT array panel shown in FIG. 1 taken along the lines III-III' and III'-III".

A blocking film 111, preferably comprising silicon oxide ($SiO_2$) or silicon nitride (SiNx), is formed on an insulating substrate 110 such as, for example, transparent glass, quartz, or sapphire. The blocking film 111 may have a multi-layered structure.

A plurality of semiconductor islands 151, preferably comprising polysilicon are formed on the blocking film 111. Each of the semiconductor islands 151 is extended in the horizontal direction and both end portions of a semiconductor island are wider than other portions thereof for connection with other layers.

To form the plurality of semiconductor islands 151, an amorphous layer is crystallized by sequential lateral solidification. Referring to FIG. 2, the semiconductor islands 151 have a plurality of protrusions P formed in the vertical direction at uniform intervals on the surface of the semiconductor islands 151. The length X in the horizontal direction of the semiconductor islands 151 is a multiple of the distance between two protrusions P.

The distances between the protrusions P are shown by "S", and the length X in the horizontal direction of the semiconductor islands 151 is represented as X=S×N, where N is an integer.

Each of the semiconductor islands 151 includes a plurality of extrinsic regions containing N-type or P-type conductive impurities and at least one intrinsic region containing little of the conductive impurities, and the extrinsic regions include a plurality of highly doped regions and a plurality of lightly doped regions.

With regard to the semiconductor island 151, the intrinsic regions include a channel region 154a, and the extrinsic regions include a plurality of heavily doped regions such as source and drain regions 153, 155 and an intermediate region 153S separated from each other with respect to the channel regions 154a. The extrinsic regions further include a plurality of lightly doped regions 152a disposed between the intrinsic regions 154a and the heavily doped regions 153, 155, and 153S. The number of heavily doped regions 153, 155 and 153S may vary, and the number of channel regions may vary depending on the number of heavily doped regions 153, 155 and 153S.

The lightly doped regions 152a have relatively small thicknesses and lengths compared with the heavily doped regions 153 and 155, and are disposed close to surfaces of the semiconductor islands 151. The lightly doped regions 152a are referred to as "lightly doped drain (LDD) regions", and they prevent leakage current of TFTs. The LDD regions may be substituted with offset regions that contain substantially no impurities.

Examples of N type impurity include phosphorous (P) and arsenic (As), and examples of P type impurity include boron (B) and gallium (Ga).

A gate insulating layer 140 made of silicon oxide ($SiO_2$) or silicon nitride (SiNx) is formed with a thickness of hundreds of angstroms on the semiconductor islands 151 and the blocking layer 111.

A plurality of gate conductors including a plurality of gate lines 121 and a plurality of storage electrode lines 131 are formed on the gate insulating layer 140.

The gate lines 121 for transmitting gate signals extend substantially in a transverse direction and include a plurality of gate electrodes 124a protruding to overlap the channel areas 154a of the semiconductor islands 151. Each gate line 121 may include an expanded end portion having a large area for contact with another layer or an external driving circuit. The gate lines 121 may be directly connected to a gate driving circuit for generating the gate signals, which may be integrated on the substrate 110. The gate electrodes 124a may be expanded to overlap the LDD regions 152a and 152b.

The storage electrode lines 131 are supplied with a predetermined voltage such as a common voltage, and include a plurality of storage electrodes 137 protruding perpendicular to the neighboring gate lines 121. The storage electrode lines are disposed between two gate lines 121 adjacent thereto.

The gate conductors 121 and 131 are preferably made of a low resistivity material including, for example, an Al-containing metal such as Al and an Al alloy (e.g. Al—Nd), an Ag-containing metal such as Ag and an Ag alloy, a Cu-containing metal such as Cu and a Cu alloy, a Mo-containing metal such as Mo and a Mo alloy, Cr, Ti, and/or Ta. The gate conductors 121, 131, and 124b may have a multi-layered structure including two films having different physical characteristics. One of the two films preferably includes a low resistivity metal including, for example, an Al-containing metal, an Ag-containing metal, and/or a Cu-containing metal for reducing signal delay or voltage drop in the gate conductors 121 and 131. The other film preferably includes a material such as Cr, Mo, a Mo alloy, Ta, and/or Ti, which have good physical, chemical, and electrical contact characteristics with other materials such as indium tin oxide (ITO) and indium zinc oxide (IZO). Examples of the combination of the two films are a lower Cr film and an upper Al—Nd alloy film, and a lower Al film and an upper Mo film.

The lateral sides of the gate conductors 121 and 131 are inclined relative to a surface of the substrate 110 to enhance adhesion characteristics.

An interlayer insulating layer 160 is formed on the gate conductors 121 and 131. The interlayer insulating layer 160 is preferably made of a photosensitive organic material having a good flatness characteristic, a low dielectric insulating material such as, for example, a-Si:C:O and a-Si:O:F formed by plasma enhanced chemical vapor deposition (PECVD), or an inorganic material such as silicon nitride and silicon oxide.

The interlayer insulating layer 160 has a plurality of contact holes 163 and 165 respectively exposing the source regions 153 and the drain regions 155.

A plurality of data conductors including a plurality of data lines 171 and a plurality of output electrodes 175 are formed on the interlayer insulating layer 160.

The data lines 171 for transmitting data voltages extend substantially in the longitudinal direction and intersect the gate lines 121. Each data line 171 includes a plurality of input electrodes 173 connected to the source regions 153 through the contact holes 163. Each data line 171 includes an expanded end portion having a large area for contact with another layer or an external driving circuit. The data lines 171 may be directly connected to a data driving circuit for generating the gate signals, which may be integrated on the substrate 110. The storage electrodes 137 are disposed between data lines 171 adjacent thereto.

The output electrodes 175 are separated from the input electrodes 173 and connected to the drain regions 155 through the contact holes 165, and overlap the storage electrode 137 to form a storage capacitor.

The data conductors 171 and 175 preferably include a refractory metal such as, for example, Cr, Mo, Ti, Ta, or alloys thereof. The data conductors 171 and 175 may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121 and 131, the data conductors 171 and 175 have tapered lateral sides relative to a surface of the substrate 110.

A passivation layer 180 is formed on the data conductors 171 and 175 and the interlayer insulating layer 160. The passivation layer 180 also preferably includes a photosensitive organic material having a good flatness characteristic, a low dielectric insulating material having, for example, a value less than about 4.0, such as a-Si:C:O and a-Si:O:F formed by PECVD, or an inorganic material such as silicon nitride and silicon oxide.

The passivation layer 180 has a plurality of contact holes 185 and 182 respectively exposing the output electrodes 175 and end portions of the data lines 171. The passivation layer 180 and the interlayer insulating layer 160 may further have a plurality of contact holes (not shown) exposing end portions of the gate lines 121.

A plurality of pixel electrodes 190 and a plurality of contact assistants 82, which preferably include at least one of a transparent conductor such as, for example, ITO or IZO and an opaque reflective conductor such as, for example, Al or Ag, are formed on the passivation layer 180.

The pixel electrodes 190 are physically and electrically connected to the output electrodes 175 through the contact holes 185 such that the pixel electrodes 190 receive the data voltages from the drain regions 155 via the output electrodes 175.

The contact assistants 82 are connected to the end portions of the data lines 171 through the contact holes 182. The contact assistants 82 protect the end portions 179 and complement the adhesion of the end portions 179 to external devices.

The pixel electrodes 190 supplied with the data voltages generate electric fields in cooperation with the common electrode (not shown) on the upper panel (not shown), which determine orientations of liquid crystal molecules in a liquid crystal layer (not shown).

In the liquid display, a pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrodes 133 as well as the storage lines 131. The storage electrodes 133 may omitted depend on a required amount of storage capacitance.

The pixel electrodes 190 optionally overlap the gate lines 121 and the data lines 171 to increase aperture ratio.

A method of manufacturing the TFT array panel shown in FIGS. 1 to 3 according to an embodiment of the present invention will be now described with reference to FIGS. 4 to 12B as well as FIGS. 1 to 3.

Figure 4:
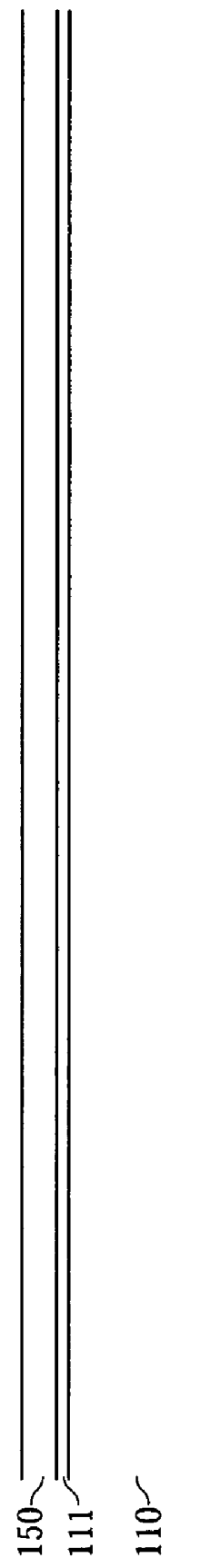
FIG. 4 is a sectional view of the TFT array panel shown in FIGS. 1 to 3 in a first step of a manufacturing method thereof according to an embodiment of the present invention.
Figure 5:
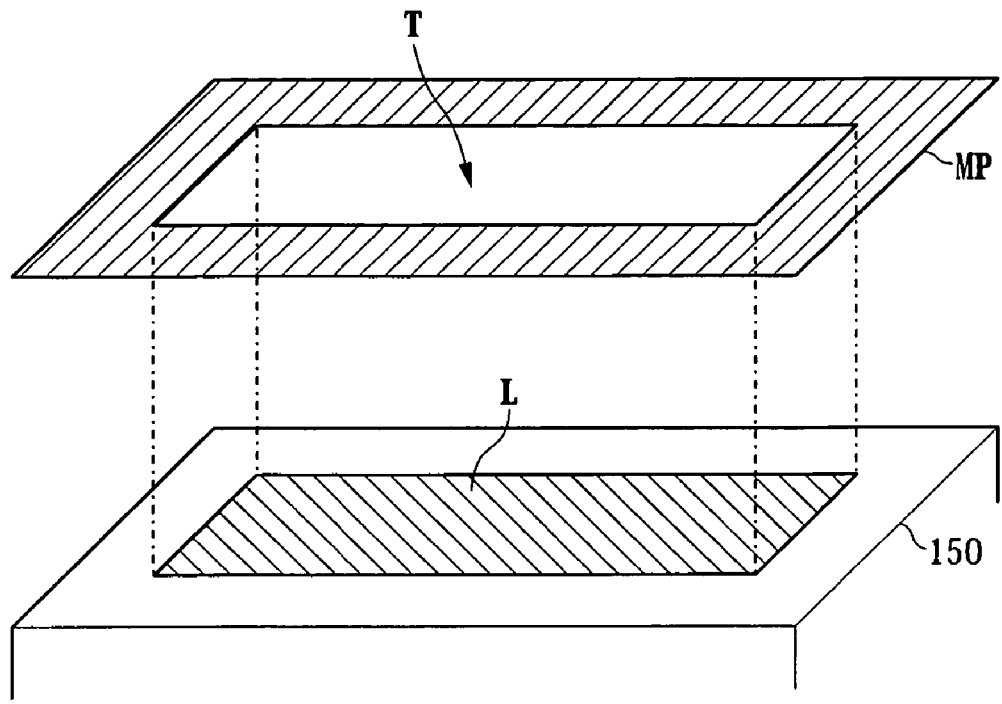
FIG. 5 schematically shows illumination of a laser beam through a mask having a slit in an SLS process according to an embodiment of the present invention.
Figure 6:
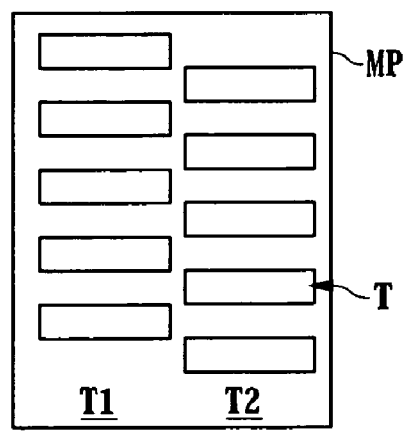
FIG. 6 is a schematic view of a crystallization mask according to an embodiment of the present invention.
Figure 7:
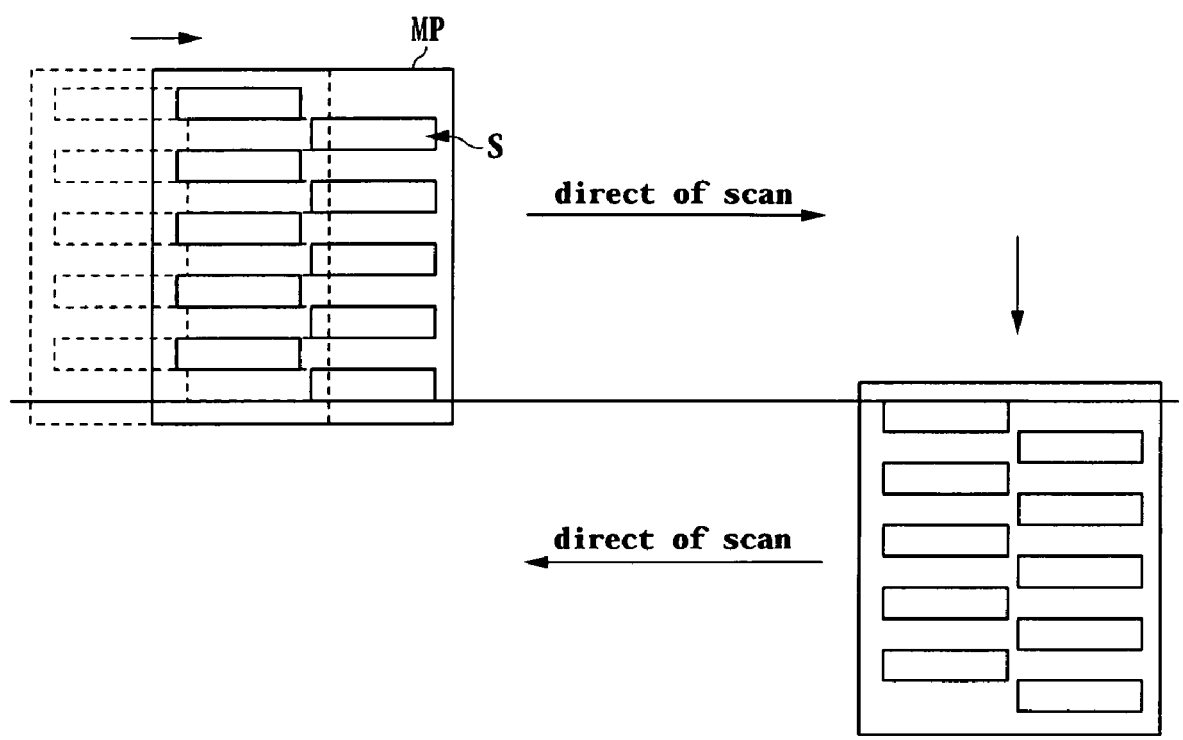
FIG. 7 is a schematic diagram showing an SLS process for crystallizing amorphous silicon into polysilicon according to an embodiment of the present invention.
Figure 8C:
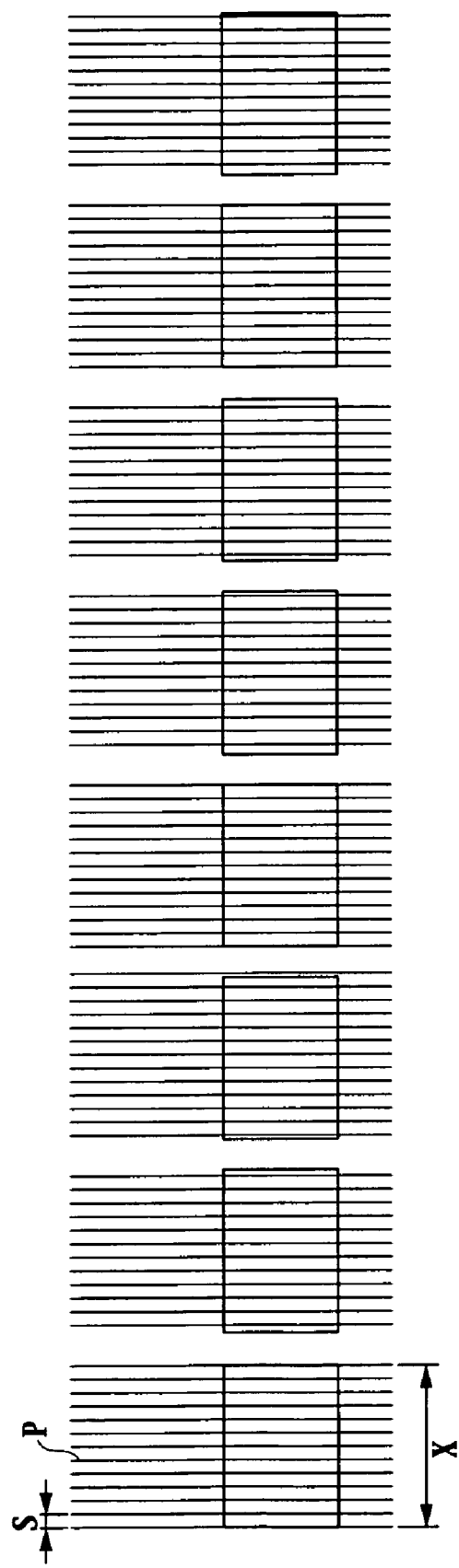
FIG. 8C is a layout view showing the positions of the semiconductor islands and the number of the protrusions disposed on the semiconductor islands in a plurality of pixels of the TFT array panel shown in FIG. 8A.
Figure 9A:
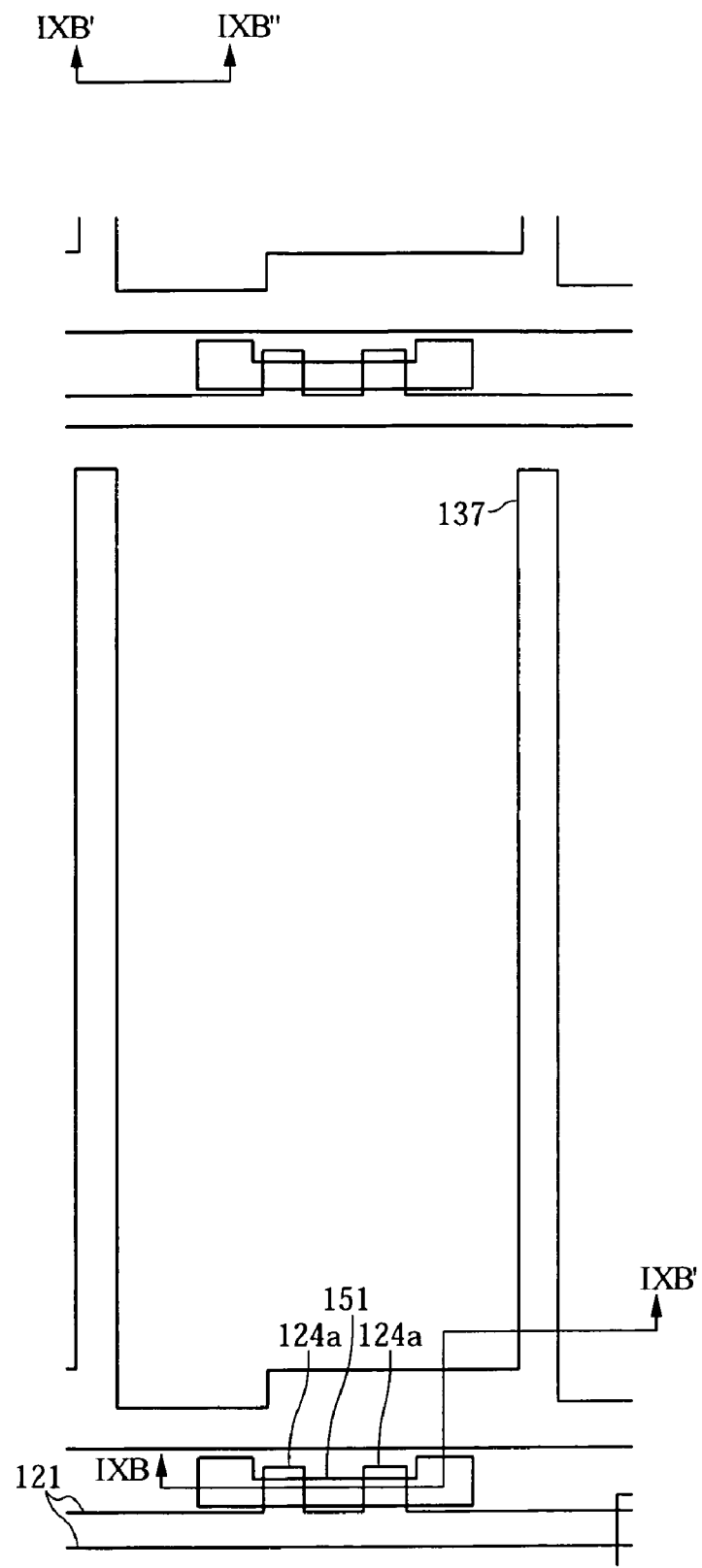
FIG. 9A is a layout view of the TFT array panel in a step following the step shown in FIG. 8A.
Figure 10:
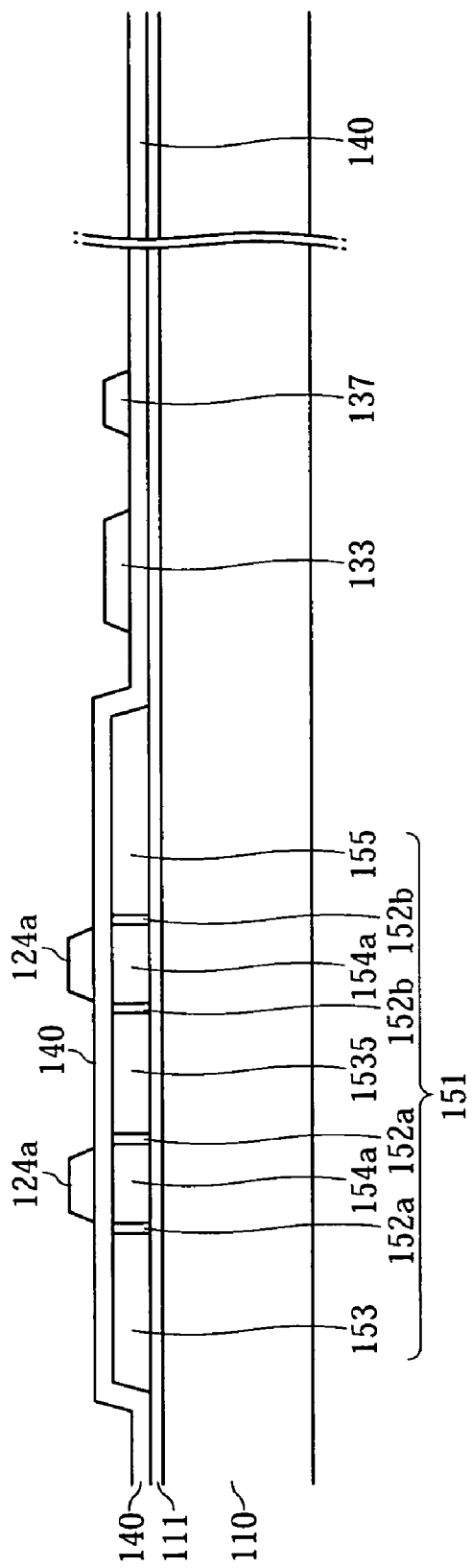
FIG. 10 is a sectional view of the TFT array panel in a step following the step shown in FIG. 9B.
Figure 11A:
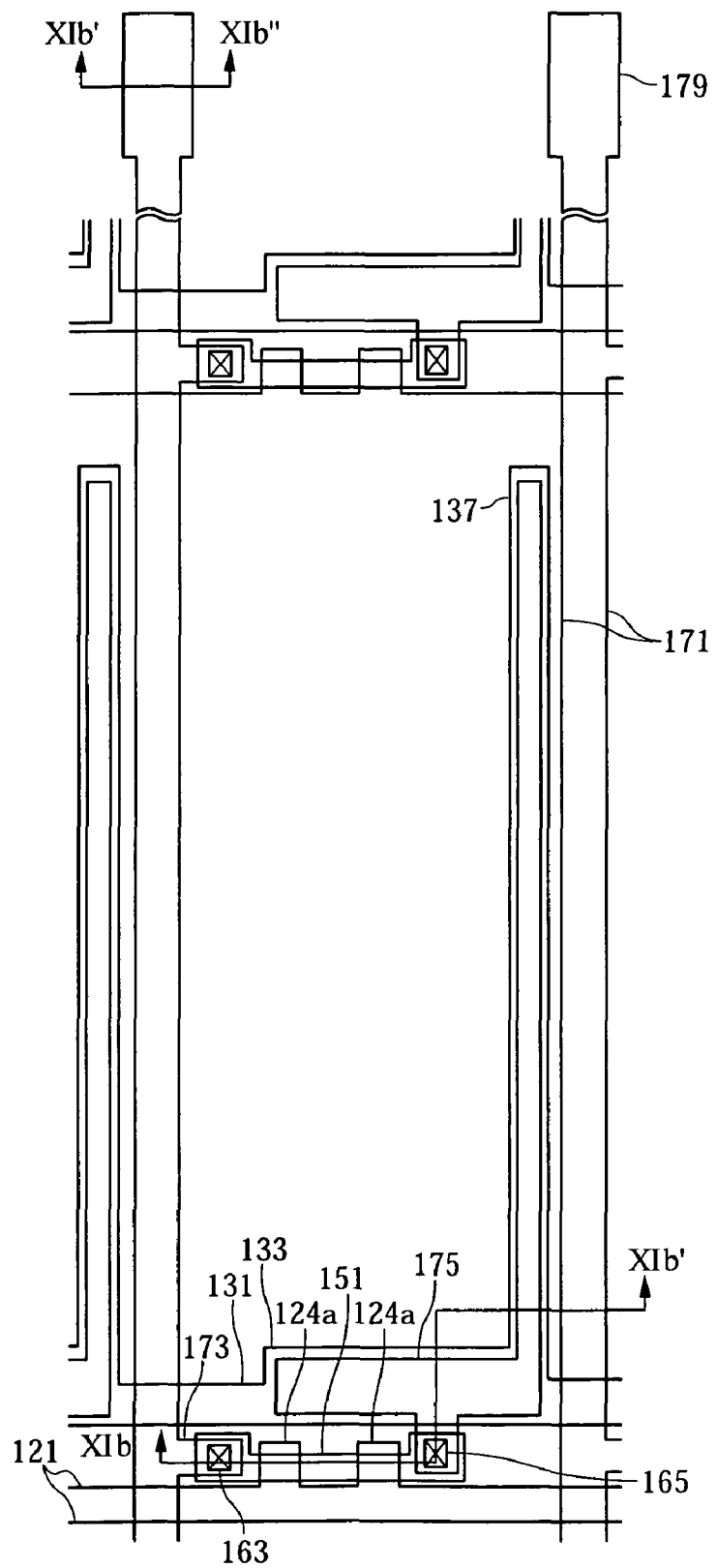
FIG. 11A is a layout view of the TFT array panel in a step following the step shown in FIG. 10.
Figure 11B:
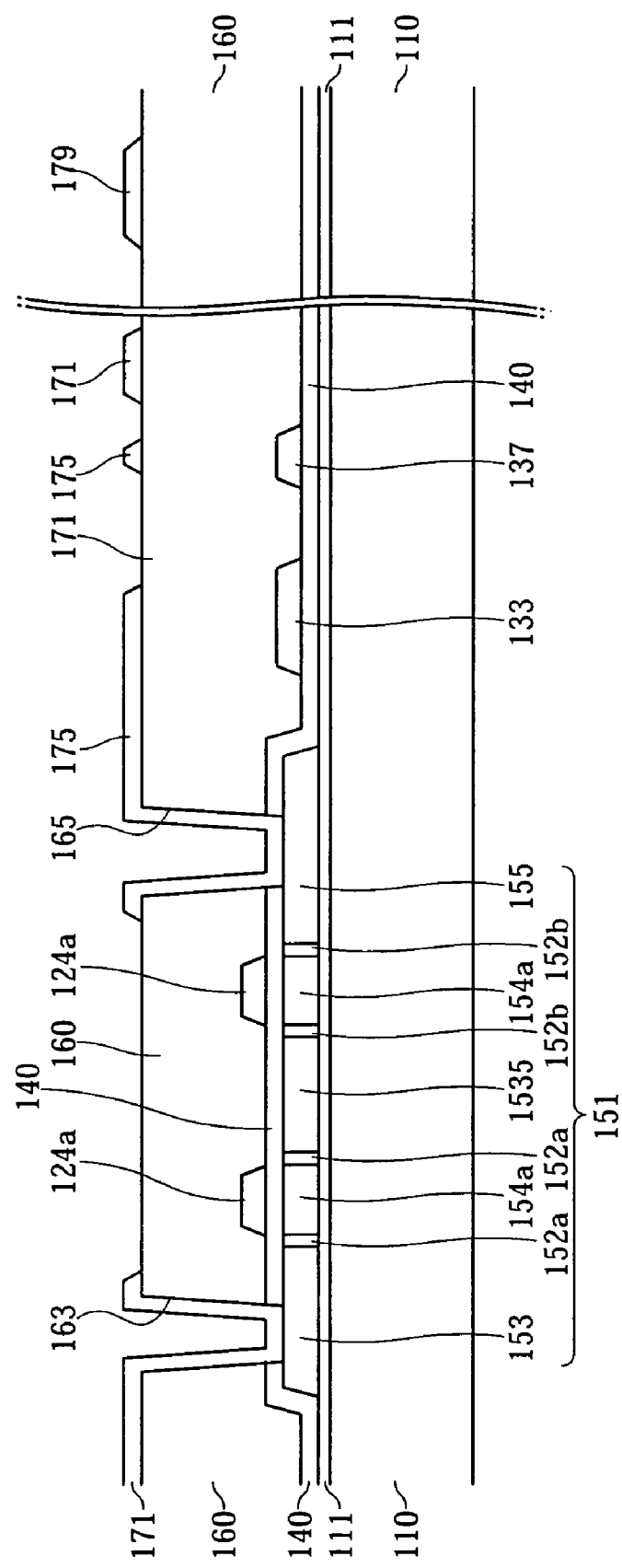
FIG. 11B is a sectional view of the TFT array panel shown in FIG. 11A taken along the lines XIB-XIB' and XIB'-XIB"
Figure 12A:
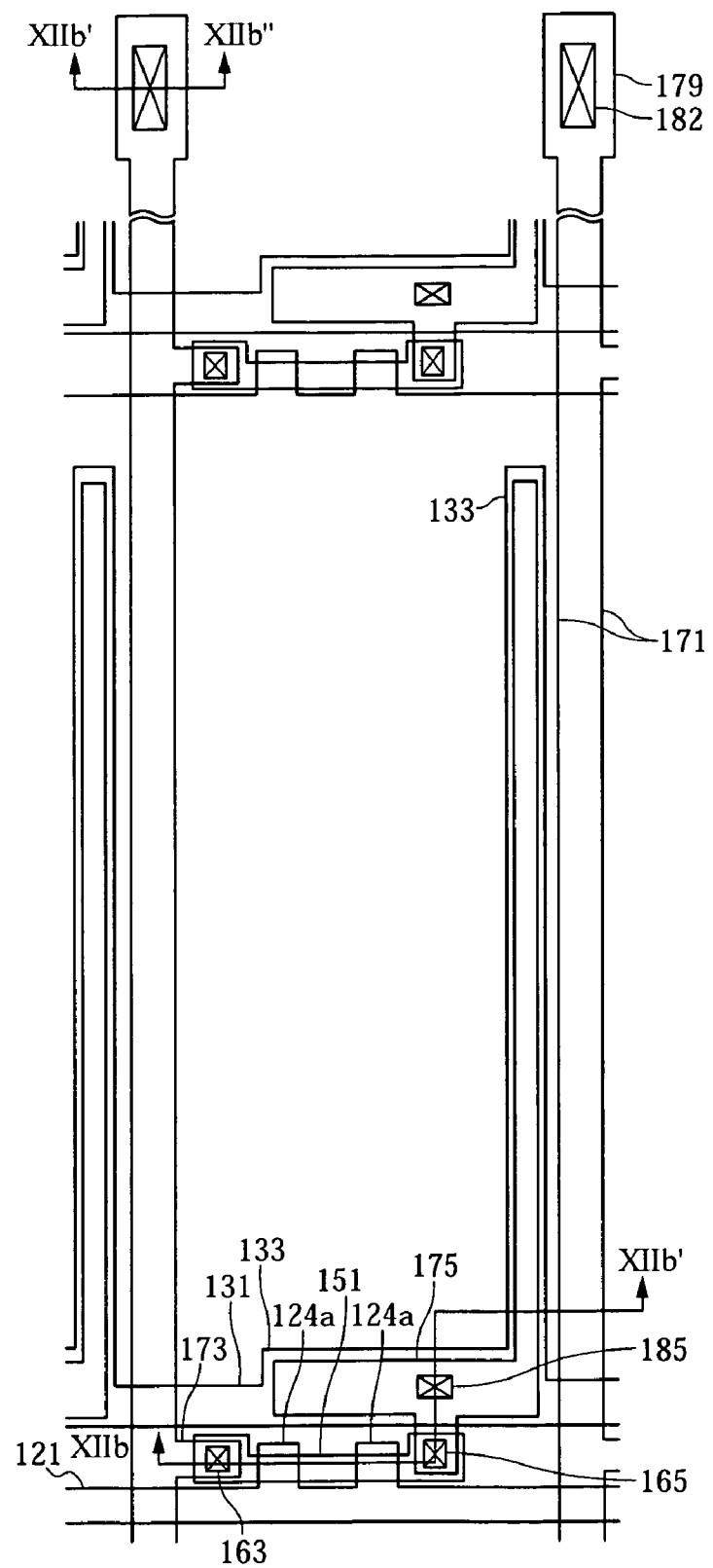
FIG. 12A is a layout view of the TFT array panel in a step following the step shown in FIG. 11A.
Figure 12B:
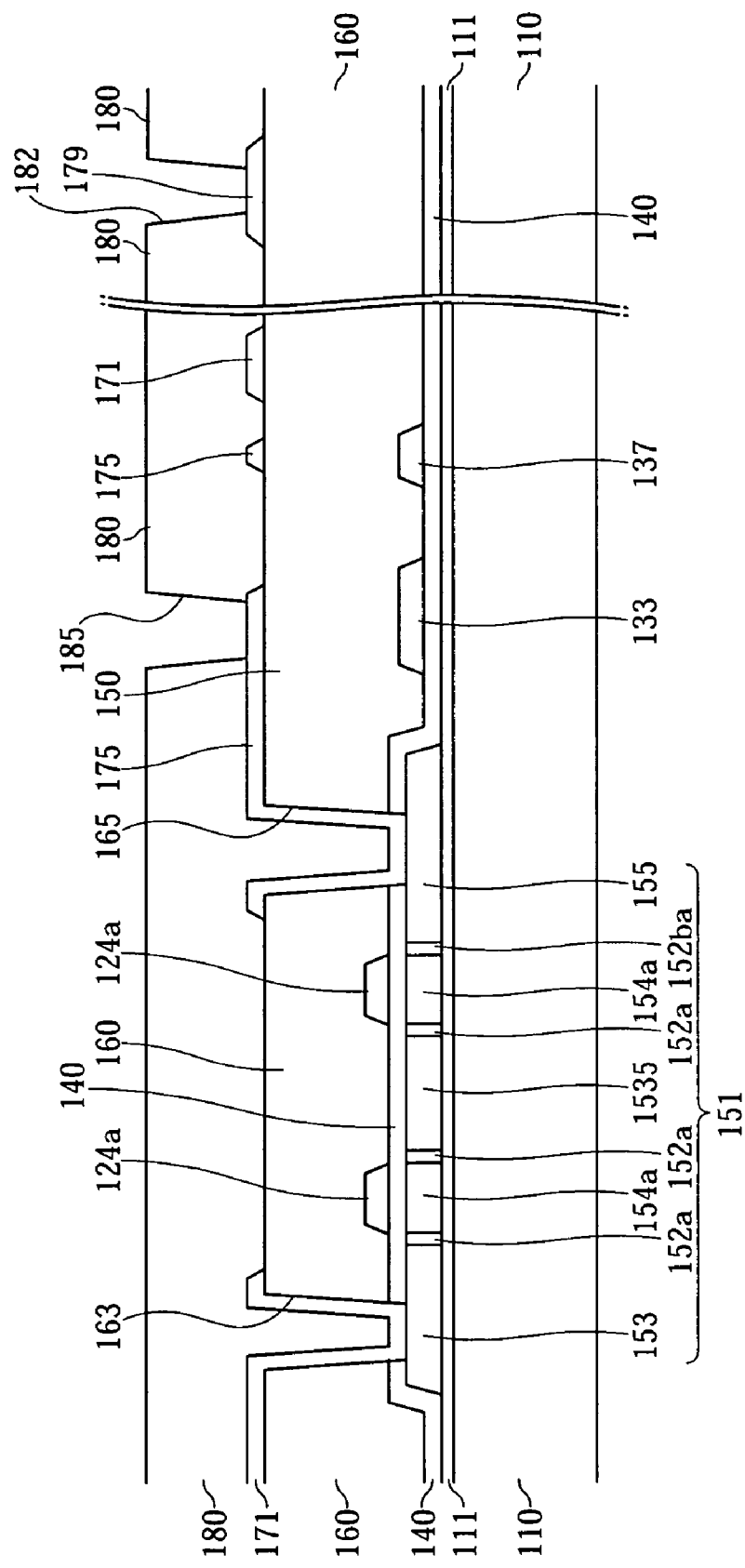
FIG. 12B is a sectional view of the TFT array panel shown in FIG. 12A taken along the lines XIIB-XIIB' and XIIB'-XIIB"

FIG. 4 is a sectional view of the TFT array panel shown in FIGS. 1 to 3 in a first step of a manufacturing method thereof according to an embodiment of the present invention. FIG. 5 schematically shows illumination of a laser beam through a mask having a slit in an SLS process according to an embodiment of the present invention. FIG. 6 is a schematic view of a crystallization mask according to an embodiment of the present invention. FIG. 7 is a schematic diagram showing an SLS process for crystallizing amorphous silicon into polysilicon according to an embodiment of the present invention. FIG. 8A is a layout view of the TFT array panel in a step following the step shown in FIG. 4. FIG. 8B is a sectional view of the TFT array panel shown in FIG. 8A taken along the lines VIIIB-VIIIB' and VIIIB'-VIIIB". FIG. 8C is a layout view showing the positions of the semiconductor islands and the number of the protrusions disposed on the semiconductor islands in a plurality of pixels of the TFT array panel shown in FIG. 8A. FIG. 9A is a layout view of the TFT array panel in a step following the step shown in FIG. 8A. FIG. 9B is a sectional view of the TFT array panel shown in FIG. 9A taken along the lines IXB-IXB' and IXB'-IXB. FIG. 10 is a sectional view of the TFT array panel in a step following the step shown in FIG. 9B. FIG. 11A is a layout view of the TFT array panel in a step following the step shown in FIG. 10. FIG. 11B is a sectional view of the TFT array panel shown in FIG. 11A taken along the lines XIB-XIB' and XIB'-XIB. FIG. 12A is a layout view of the TFT array panel in a step following the step shown in FIG. 11A. FIG. 12B is a sectional view of the TFT array panel shown in FIG. 12A taken along the lines XIIB-XIIB' and XIIB'-XIIB".

Referring to FIG. 4, a blocking film 11 is formed on an insulating substrate 110, and a semiconductor layer 150 preferably made of amorphous silicon is deposited by CVD (chemical vapor deposition) thereon.

The semiconductor layer is then crystallized by sequential lateral solidification.

The sequential lateral solidification process will be described in detail with reference to FIGS. 5 and 6.

As shown in FIGS. 5 and 6, in the SLS process, a laser beam is illuminated on a semiconductor layer 150 made of amorphous silicon and formed on an insulating substrate 110 through a mask MP having a plurality of transmissive areas T in the form of slits. Then, the amorphous silicon, in a plurality of local regions of the semiconductor layer 150 facing the transmissive areas T, which is illuminated by the laser beam, is completely melted such that a plurality of liquid phase regions L are formed in an area of the semiconductor layer 150.

As shown in FIG. 6, the mask MP includes a plurality of columns of slits T1 and T2 and each slit in the slit columns T1 and T2 is elongated in a transverse direction. The slits T1 and T2 in each column are arranged with a predetermined pitch and the slits T1 and T2 in adjacent two columns are offset by about half of the pitch. Extensions of the transverse edges of the slits T1 or T2 in a column pass through the slits T2 or T1 in the adjacent column.

A grain of polycrystalline silicon grows from a boundary surface, between a liquid phase region L exposed to the laser beam and a solid phase region that is not exposed to the laser beam, along a direction perpendicular to the boundary surface. The grains stop growing when they meet at the center of the liquid phase region L, and a plurality of protrusions are formed on the positions where the grains stop growing.

Referring to FIG. 7, the SLS process illustrated in FIG. 5 moves the substrate by a width of the column in the transverse direction (e.g., x direction) with respect to the mask MP after irradiating laser beams through the mask (referred to as a shot). Since the slits T1 and T2 are elongated in the x direction, the grain growth proceeds in the y direction by a width of the slits T1 and T2 to crystallize the semiconductor layer 150.

Next, as shown in FIGS. 8A and 8B, the semiconductor layer 150 is etched by photolithography to form a plurality of semiconductor islands 151. The length X in the horizontal direction of the semiconductor islands 151 is a multiple of the distance S between the protrusions P. In other words, X=SN, where N is an integer. Accordingly, all of the semiconductor islands 151 have the same number of the protrusions P, as shown in FIG. 8C.

In FIG. 8C, the semiconductor islands 151 are shown with a rectangular shape, and the twelve (12) protrusions P are disposed on the semiconductor islands 151 with the interval S, for example. When the edges of the semiconductor islands 151 overlap the protrusions P, the semiconductor islands 151 includes two half protrusions P, which overlap the edges of the semiconductor islands 151. Accordingly, the semiconductor islands 151 include twelve (12) total protrusions P by adding the eleven (11) protrusions P and the two half protrusions P.

As described above, all of the semiconductor islands 151 have the same number of the protrusions P such that the characteristics of thin film transistors are uniform in the whole pixel, thereby enhancing the display quality of the display device.

Next, referring to FIGS. 9a and 9b, a gate insulating layer 140 is deposited on the substrate 110 by CVD (chemical vapor deposition), and a gate conductor film is formed thereon. A photoresist (PR) is formed on the gate conductor film, and the gate conductor film is patterned using the photoresist PR as an etch mask to form a plurality of gate conductors that include a plurality of gate lines 121 including gate electrodes 124a and a plurality of storage electrode lines 131 including a plurality of storage electrodes 133. The gate conductor film is over-etched with respect to the photoresist PR. The over-etching causes edges of the gate conductors 121 and 131 lie within edges of the photoresist PR.

Next, high-concentration N-type or P-type impurities are introduced with a low energy of about 3-40 eV into the semiconductor islands 151 by PECVD or plasma emulsion such that regions of the semiconductor islands 151 disposed under the photoresist PR are not doped and that remaining regions of the semiconductor islands 151 are heavily doped, thereby forming source and drain regions 153 and 155 as well as an intermediate region 153S.

Referring to FIG. 10, the photoresist PR is removed, and low-concentration N-type or P-type impurity is implanted with a high energy into the semiconductor islands 151 by using scanning equipment or ion beam equipment such that regions of the semiconductor islands 151 disposed under the gate conductors 121 and 131 are not doped and remaining regions of the semiconductor islands 151 are heavily doped to form lightly doped regions 152a as well as channel regions 154a. To form the lightly doped regions 152a, multiple layers having different etch rates, or a spacer formed at the sides of the gate electrode 124a may be used in addition to the photoresist.

Referring to FIGS. 11A and 11B, an interlayer insulating layer 160 is deposited and patterned to form a plurality of contact holes 163 and 165 exposing the source regions 153 and the drain regions 155 along with the gate insulating layer 140.

Next, a plurality of data conductors including a plurality of data lines 171 are formed on the interlayer insulating layer 160. The plurality of data lines 171 include a plurality of input electrodes 173, and a plurality of drain electrodes 175.

Referring to FIGS. 12A and 12B, a passivation layer 180 is deposited and patterned to form a plurality of contact holes 185 and 182 exposing the output electrodes 175 and the end portions 179 of the data lines 171.

Referring to FIGS. 1 and 3, a plurality of pixel electrodes 190 and a plurality of contact assistants 182 are formed on the passivation layer 180.

The above descriptions may be adapted to other flat panel display devices, such as, for example, an OLED.

Figure 13:
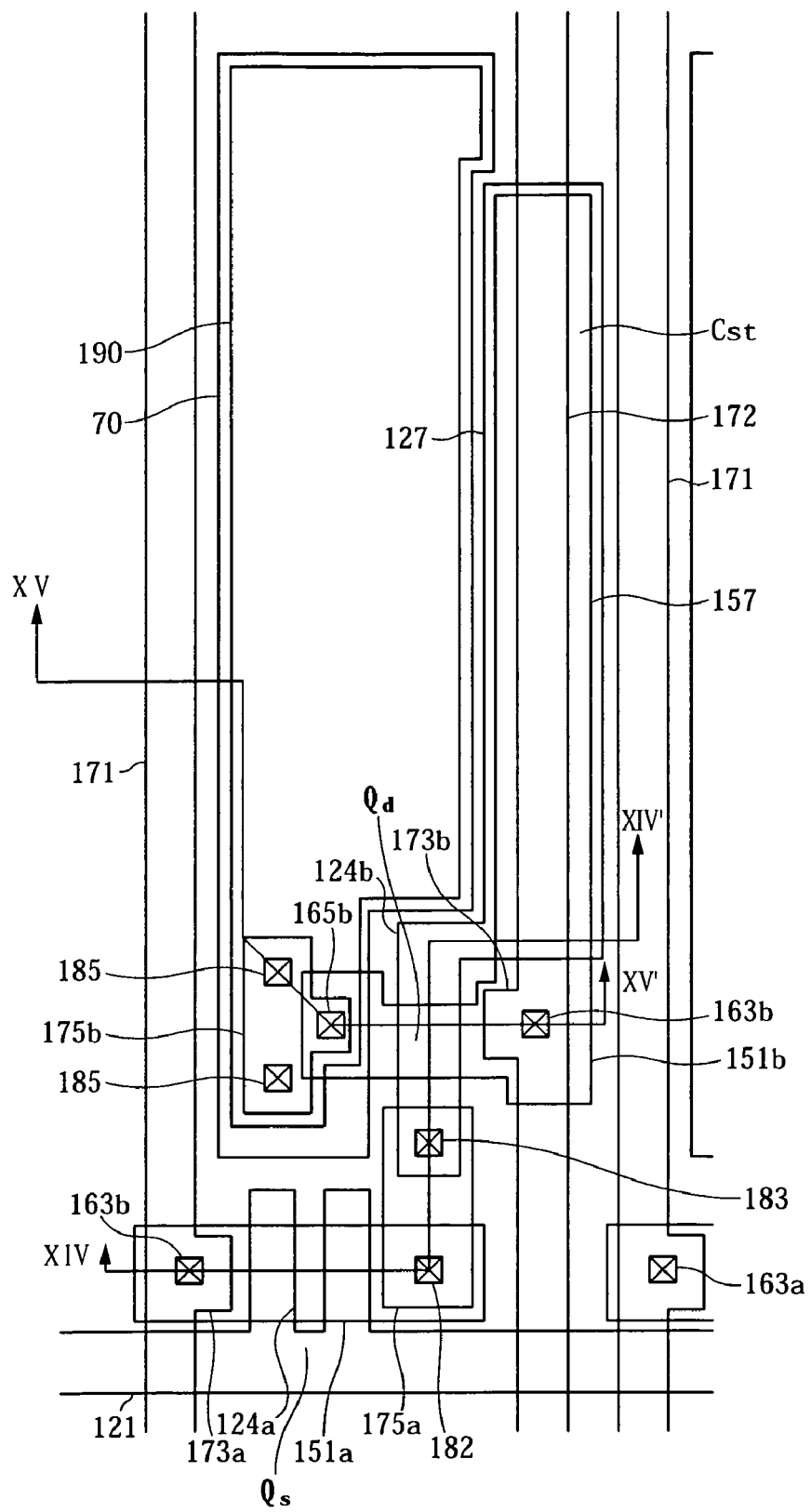
FIG. 13 is a layout view of a TFT array panel for an OLED display according to an embodiment of the present invention.
Figure 14:
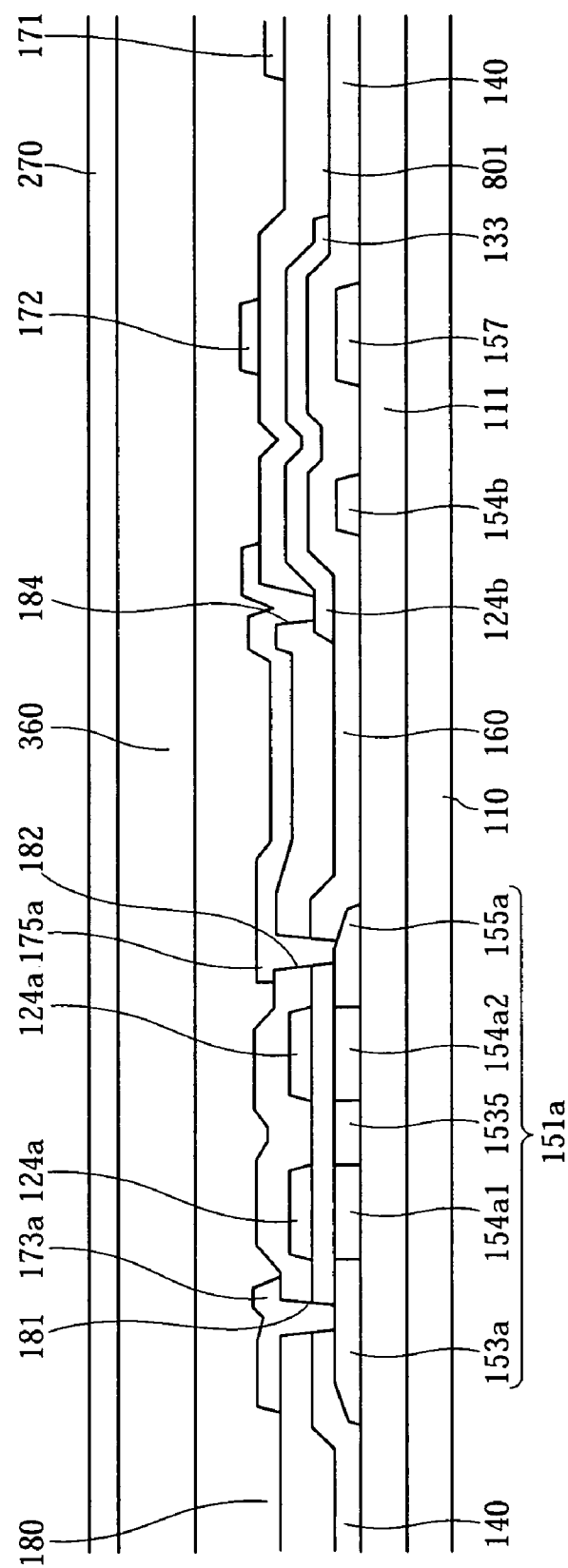
FIGS. 14 and 15 are sectional views of the TFT array panel shown in FIG. 13 taken along the lines XIV-XIV' and XV-XV', respectively.
Figure 15:
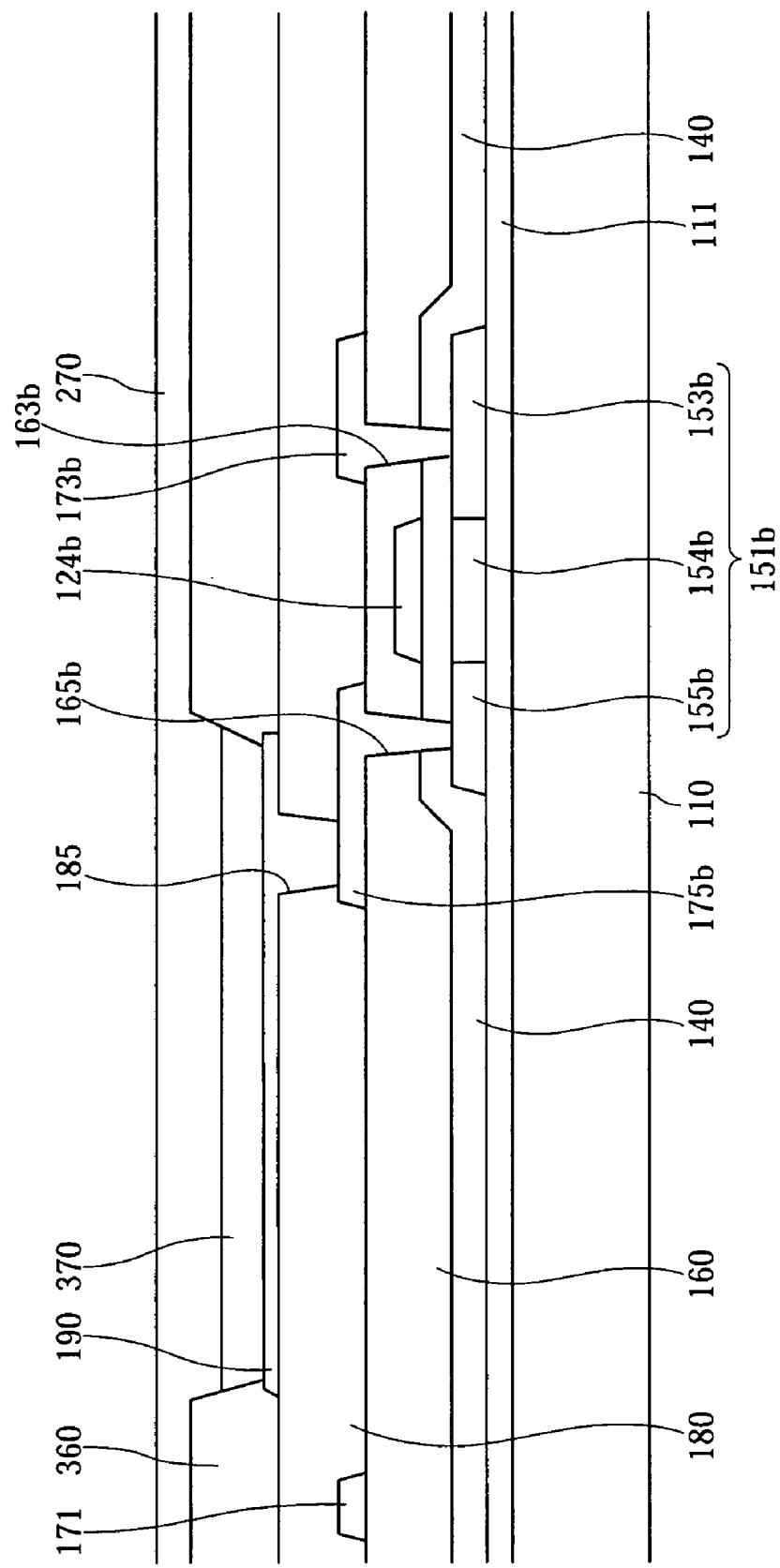
Figure 16:
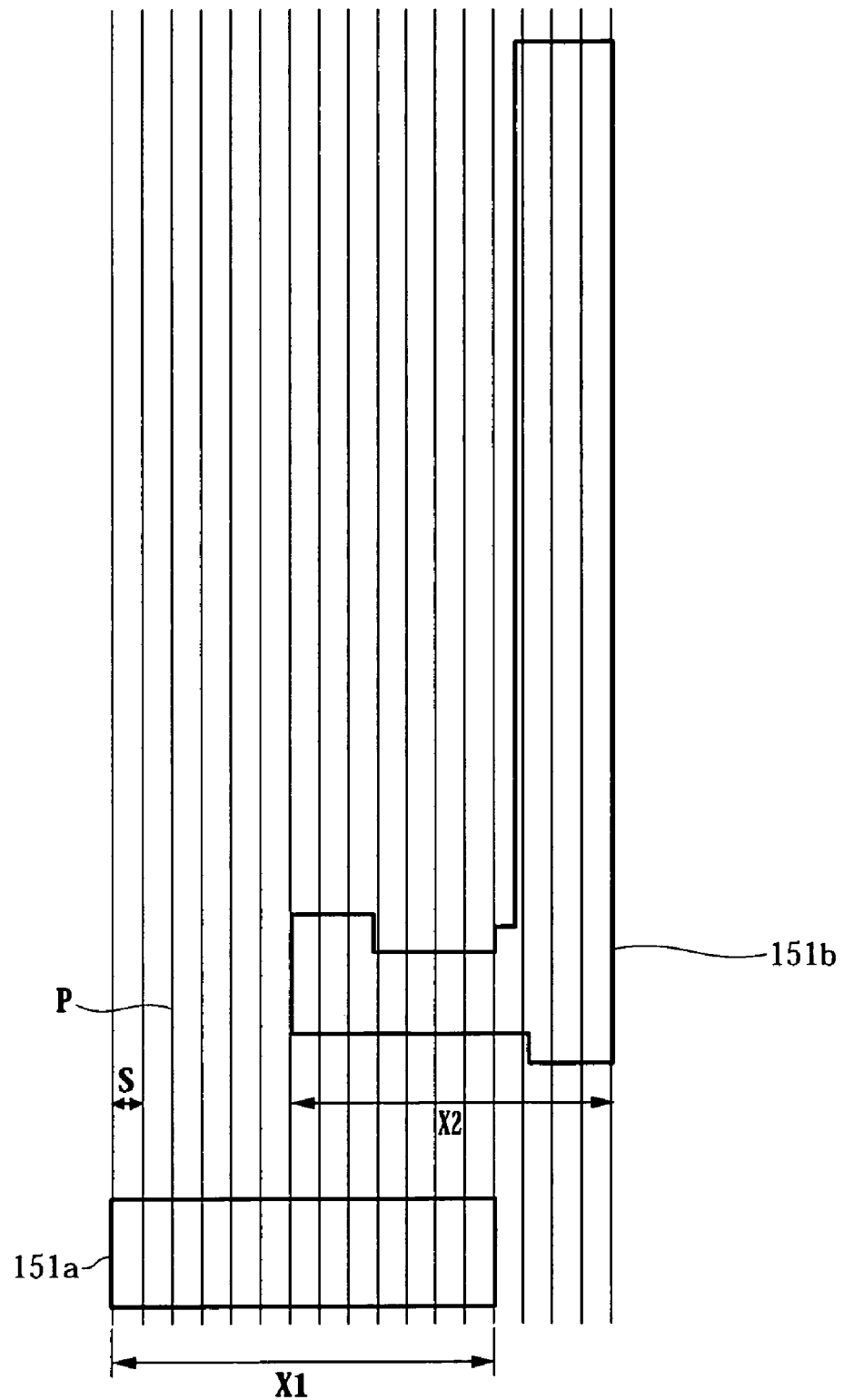
FIG. 16 is a layout view showing the positions of the semiconductor islands and the number of the protrusions disposed on the semiconductor islands in a plurality of pixels of the TFT array panel for the OLED display shown in FIG. 13.

FIG. 13 is a layout view of a TFT array panel for an OLED display according to an embodiment of the present invention. FIGS. 14 and 15 are sectional views of the TFT array panel shown in FIG. 13 taken along the lines XIV-XIV' and XV-XV', respectively. FIG. 16 is a layout view showing the positions of the semiconductor islands and the number of the protrusions disposed on the semiconductor islands in a plurality of pixels of the TFT array panel for the OLED display shown in FIG. 13.

A blocking layer 111 preferably comprising silicon oxide or silicon nitride is formed on an insulating substrate 110 preferably comprising transparent glass. The blocking film 111 may have a dual-layered structure.

A plurality of semiconductor islands 151a and 151b preferably comprising polysilicon are formed on the blocking film 111. Each of the semiconductor islands 151a and 151b includes a plurality of extrinsic regions containing N type or P type conductive impurity and at least one intrinsic region hardly containing conductive impurity.

Regarding a semiconductor island 151a for a switching TFT, the extrinsic regions include a first source region 153a, an intermediate region 153S, and a first drain region 155a, which are doped with N type impurity and separated from one another, and the intrinsic regions include, for example, a pair of (first) channel regions 154a1 and 154a2 disposed between the extrinsic regions 153a, 153S and 155a.

Concerning a semiconductor island 151b for a driving TFT, the extrinsic regions include a second source region 153b and a second drain region 155b, which are doped with P type impurity and separated from one another. The intrinsic region includes a channel region 154b disposed between the second source region 153b and the second drain region 155b. The second source region 153b extends to form a storage region 157.

The extrinsic regions may further include lightly doped regions (not shown) disposed between the channel regions 154a1, 154a2 and 154b and the source and the drain regions 153a, 155a, 153b and 155b. The lightly doped regions may be substituted with offset regions that contain substantially no impurity.

Alternatively, the extrinsic regions 153a and 155a of the first semiconductor islands 151a are doped with P type impurity, while the extrinsic regions 153b and 155b of the second semiconductor islands 151b are doped with N type impurity, depending on driving conditions. The conductive impurity includes P type impurity such as, for example, boron (B) and gallium (Ga) and N type impurity such as, for example, phosphorous (P) and arsenic (As).

The semiconductor islands 151a and 151b may be made of amorphous silicon. In this case, there are no impurity regions and ohmic contacts for improving contact characteristics between semiconductor islands 151a and 151b and other metal layers may be formed on the semiconductor islands 151a and 151b.

Similar to length X described above, the lengths X1 and X2 in the horizontal direction of the semiconductor islands 151a and 151b are multiples of the distances S between the protrusions P. For example, the lengths X1 and X2 in the horizontal direction of the semiconductor islands 151a and 151b are S×12, and S×10, as shown in FIG. 16.

A gate insulating layer 140 preferably comprising silicon oxide or silicon nitride is formed on the semiconductor islands 151a and 151b and the blocking film 111.

A plurality of gate conductors including a plurality of gate lines 121 are formed on the gate insulating layer 140. The plurality of gate lines 121 include a plurality of pairs of first gate electrodes 124a and a plurality of second gate electrodes 124b.

The gate lines 121 for transmitting gate signals extend substantially in a transverse direction. Each pair of first gate electrodes 124a protrude upward from the gate line 121 and they intersect the first semiconductor islands 151a such that they overlap the pair of the first channel regions 154a1 and 154a2. Each gate line 121 may include an expanded end portion having a large area for contact with another layer or an external driving circuit. The gate lines 121 may be directly connected to a gate driving circuit for generating the gate signals, which may be integrated on the substrate 110.

The second gate electrodes 124b are separated from the gate lines 121 and intersect the second semiconductor islands 151b such that they overlap the second channel regions 154b. The second gate electrodes 124b extend to form storage electrodes 127 overlapping the storage electrode regions 157 of the second semiconductor islands 151b to form storage capacitors.

The gate conductors 121 and 124b preferably include low resistivity material including, for example, Al containing metal such as Al and Al alloy (e.g. Al—Nd), Ag containing metal such as Ag and Ag alloy, and/or Cu containing metal such as Cu and Cu alloy. The gate conductors 121 and 124b may have a multi-layered structure including two films having different physical characteristics. One of the two films preferably includes low resistivity metal including, for example, Al containing metal, Ag containing metal, and/or Cu containing metal for reducing signal delay or voltage drop in the gate conductors 121 and 124b. The other film preferably comprises material such as, for example, Cr, Mo and Mo alloy, Ta and/or Ti, which has good physical, chemical, and electrical contact characteristics with other materials such as indium tin oxide (ITO) or indium zinc oxide (IZO). Examples of the combination of the two films are a lower Cr film and an upper Al—Nd alloy film and a lower Al film and an upper Mo film.

The lateral sides of the gate conductors 121 and 124b are inclined relative to a surface of the substrate 110, and the inclination angle thereof ranges about 30 to about 80 degrees.

An interlayer insulating film 160 is formed on the gate conductors 121 and 124b. The interlayer insulating layer 160 preferably comprises photosensitive organic material having a good flatness characteristic, low dielectric insulating material having a value less than about 4.0, such as, for example, a-Si:C:O and a-Si:O:F formed by plasma enhanced chemical vapor deposition (PECVD), or inorganic material such as silicon nitride and silicon oxide.

The interlayer insulating layer 160 has a plurality of contact holes 164 exposing the second gate electrodes 124b. In addition, the interlayer insulating layer 160 and the gate insulating layer 140 have a plurality of contact holes 163a, 163b, 165a and 165b exposing the source regions 153a and 153b and the drain regions 155a and 155b, respectively.

A plurality of data conductors, including a plurality of data lines 171, a plurality of driving voltage lines 172, and a plurality of first and second drain electrodes 175a and 175b, are formed on the interlayer insulating film 160.

The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion having a large area for contact with another layer or an external driving circuit. The data lines 171 may be directly connected to a data driving circuit for generating the gate signals, which may be integrated on the substrate 110.

The driving voltage lines 172 for transmitting driving voltages for the driving TFT extend substantially in the longitudinal direction and intersect the gate lines 121. Each voltage transmission line 172 includes a plurality of second source electrodes 173b connected to the second source regions 153b through the contact holes 163b. The driving voltage lines 172 overlap the storage electrodes 127, and may be connected to each other.

The first drain electrodes 175a are separated from the data lines 171 and the driving voltage lines 172 and connected to the first drain regions 155a through the contact holes 165 and to the second gate electrodes 124b through the contact hole 164.

The second drain electrodes 175b are separated from the data lines 171 and the driving voltage lines 172 and connected to the second drain regions 155b through the contact holes 165b.

The data conductors 171, 172, 175a and 175b preferably comprise refractory metal including, for example, Cr, Mo, Ti, Ta and/or alloys thereof. The data conductors may have a multi-layered structure preferably including a low resistivity film and a contact film. Examples of the multi-layered structure are a double-layered structure including a lower Cr film and an upper Al (alloy) film, a double-layered structure of a lower Mo (alloy) film and an upper Al (alloy) film, and a triple-layered structure of a lower Mo film, an intermediate Al film, and an upper Mo film.

Like the gate conductors 121 and 124b, the data conductors 171, 172, 175a and 175b have inclined edge profiles, and the inclination angles thereof range from about 30 to about 80 degrees.

A passivation layer 180 is formed on the data conductors 171, 172, 175a and 175b. The passivation layer 180 also preferably includes organic material, low dielectric insulating material, or inorganic material.

The passivation layer 180 has a plurality of contact holes 185 exposing the second drain electrodes 175b. The passivation layer 180 may further have a plurality of contact holes (not shown) exposing end portions of the data lines 171 and the passivation layer 180. The interlayer insulating layer 160 may have a plurality of contact holes (not shown) exposing end portions of the gate lines 121.

A plurality of pixel electrodes 190 are formed on the passivation layer 180.

The pixel electrodes 190 serve as anodes of light emitting elements and are connected to the second drain electrodes 175b through the contact holes 185. The pixel electrodes 190 preferably include a transparent conductor such as, for example, ITO or IZO. However, the pixel electrode 190 may include an opaque reflective conductor such as, for example, Al, Ag, Ca, Ba and/or Mg.

A plurality of contact assistants or connecting members (not shown) may be also formed on the passivation layer 180 such that they are connected to the exposed end portions of the gate lines 121 and/or the data lines 171.

Partitions 360 for separating pixels of the OLED are formed on the passivation layer 180 and the pixel electrodes 190. The partitions 360 surround the pixel electrodes 190 to define openings to be filled with organic light emitting material. The partitions 360 preferably comprise organic or inorganic insulating material. The partitions 360 preferably comprise, for example, photosensitive organic material including black resin. A partition 360 may play a role as a light blocking member and the manufacturing process may be simplified.

A plurality of light emitting members 370 are formed on the pixel electrodes 190 and disposed in the openings defined by the partitions 360. The light emitting members 370 preferably comprise organic material emitting primary-color lights such as red, green and blue lights. The red, green and blue light emitting members 370 are arranged at predetermined intervals.

A common electrode 270 is formed on the light emitting members 370 and the partitions 360. The common electrode 270 is supplied with the common voltage Vcom.

The common electrode 270 preferably includes a reflective material such as, for example, Ba, Ca, Ma, Al, Ag, or their alloys, or transparent material such as, for example, ITO and IZO.

In the above-described OLED, a first semiconductor island 151a, a first gate electrode 124a connected to the gate line 121, a first source electrode 153a connected to the data line 171, and a first drain electrode 155a form a switching TFT Qs. In addition, a second semiconductor island 151b, a second gate electrode 124b connected to the first drain electrode 155a, a second source electrode 153b connected to the voltage transmission line 172, and a second drain electrode 155b connected to a pixel electrode 190 form a driving TFT Qd. Furthermore, a storage region 157 connected to a first drain region 155a and a storage electrode 127 connected to a voltage transmission line 172 through a second source electrode 153b form a storage capacitor Cst. The TFTs Qs and Qd shown in FIGS. 13-15 are referred to as "top gate TFTs" since the gate electrodes 124a and 124b are disposed on the semiconductors 151a and 151b.

The switching TFT Qs transmits data signals from the data line 171 in response to a gate signal from the gate line 121. The driving TFT Qd drives a current having a magnitude depending on the voltage difference between the second control electrode 124b and the second drain electrode 175b upon receipt of the data signals. The voltage difference between the gate electrode 124b and the second source electrode 173b is stored in the storage capacitor Cst and maintained after the switching TFT Qs turns off. The light emitting diode emits light having intensity depending on the current driven by the driving TFT Qd. The monochromatic primary color lights emitted from the light emitting diodes are spatially added to display images.

The length of the semiconductor islands is a multiple of the distance between at least two protrusions. Each of the semiconductors has the same number of the protrusions, such that the characteristics of thin film transistors are uniform in the whole pixel, thereby enhancing the display quality of the display device.

Although the illustrative embodiments of the present invention have been described herein with reference to the accompanying drawings, it is to be understood that the present invention is not limited to those precise embodiments, and that various other changes and modifications may be affected therein by one of ordinary skill in the related art without departing from the spirit and scope of the invention. All such changes and modifications are intended to be included within the scope of the invention as defined in the appended claims.

What is claimed is:

1. A thin film transistor array panel, comprising:
   a substrate;
   a plurality of semiconductor islands formed on the substrate, the plurality of semiconductor islands including a plurality of first extrinsic regions, a plurality of second extrinsic regions, and a plurality of intrinsic regions;
   a gate insulating layer covering the semiconductor islands;
   a plurality of gate lines formed on the gate insulating layer and including a plurality of gate electrodes overlapping the intrinsic regions;
   a plurality of data lines formed on the gate insulating layer and connected to the plurality of first extrinsic regions; and
   a plurality of pixel electrodes connected to the plurality of second extrinsic regions,
   wherein a plurality of protrusions are formed on the surfaces of semiconductor islands with the same material as the semiconductor islands, and a length of a semiconductor island divided by a distance between two protrusions of the plurality of protrusions is substantially equal to an integer, wherein the protrusions are spaced substantially at uniform intervals, and wherein a number of the protrusions formed on each semiconductor island is the same, and wherein the protrusions formed on each semiconductor island extend across the entire semiconductor island in a direction perpendicular to a length direction of the semiconductor islands.

2. The thin film transistor array panel of claim 1, wherein the semiconductor islands are crystallized by sequential lateral solidification.

3. The thin film transistor array panel of claim 1, further comprising:
a plurality of storage electrode lines formed parallel the gate lines.

4. The thin film transistor array panel of claim 1, further comprising:
a blocking layer formed between the substrate and the semiconductor islands.

5. The thin film transistor array panel of claim 1, further comprising:
a passivation layer formed between the plurality of pixel electrodes and the plurality of gate and the data lines.

6. The thin film transistor array panel of claim 5, further comprising:
an interlayer insulating layer formed between the plurality of gate lines and the plurality of data lines; and
a plurality of output electrodes formed between the passivation layer and the interlayer insulating layer and connecting the plurality of pixel electrodes to the plurality of second extrinsic regions.

7. The thin film transistor array panel of claim 6, wherein the plurality of second extrinsic regions includes a plurality of drain regions.

8. The thin film transistor array panel of claim 1, further comprising:
a plurality of partitions formed on the plurality of pixel electrodes; and
a plurality of light emitting members formed on the plurality of pixel electrodes and disposed in openings defined by the plurality of partitions.

9. The thin film transistor array panel of claim 1, wherein the distance is between any two adjacent protrusions of the plurality of protrusions.

10. A thin film transistor array panel, comprising:
a substrate;
a plurality of semiconductor islands formed on the substrate, the plurality of semiconductor islands including a plurality of first extrinsic regions, a plurality of second extrinsic regions, and a plurality of intrinsic regions;
a plurality of gate lines formed on the substrate and including a plurality of gate electrodes overlapping the intrinsic regions;
a plurality of data lines formed on the substrate and connected to the plurality of first extrinsic regions; and
a plurality of pixel electrodes connected to the plurality of second extrinsic regions,
wherein a plurality of protrusions are formed on the surfaces of semiconductor islands with the same material as the semiconductor islands, and a length of a semiconductor island divided by a distance between two protrusions of the plurality of protrusions is substantially equal to an integer,
wherein the protrusions are spaced substantially at uniform intervals,
wherein a number of the protrusions formed on each semiconductor island is the same, and
wherein the protrusions formed on each semiconductor island extend across the entire semiconductor island in a direction perpendicular to a length direction of the semiconductor islands.

11. The thin film transistor array panel of claim 10, wherein the semiconductor islands are crystallized by sequential lateral solidification.

12. The thin film transistor array panel of claim 10, further comprising:
a blocking layer formed between the substrate and the semiconductor islands.

13. The thin film transistor array panel of claim 10, further comprising:
a plurality of partitions formed on the plurality of pixel electrodes; and a plurality of light emitting members formed on the plurality of pixel electrodes and disposed in openings defined by the plurality of partitions.

14. The thin film transistor array panel of claim 10, wherein the distance is between any two adjacent protrusions of the plurality of protrusions.

* * * * *